United States Patent [19]

Maples et al.

[11] 4,270,171

[45] May 26, 1981

[54] POSITION SENSING AND INDICATING DEVICE

[76] Inventors: James A. Maples, 876 Colorado Ave., Palo Alto, Calif. 94303; Robert B. Pepper, Box 277, Bolinas, Calif. 94924

[21] Appl. No.: 18,411

[22] Filed: Mar. 7, 1979

[51] Int. Cl.³ ............................................ H05B 39/00
[52] U.S. Cl. ..................................... 364/480; 315/292
[58] Field of Search ....................... 364/480, 483, 709; 315/292, 297; 116/205, 226, 259, 263, 279, 281, 283, 307, 321

[56] References Cited

U.S. PATENT DOCUMENTS

| | | | |
|---|---|---|---|
| 3,508,114 | 4/1970 | Johansson et al. | 315/297 X |
| 3,514,670 | 5/1970 | Isaacs | 315/297 X |
| 3,706,913 | 12/1972 | Malatchi | 315/297 |
| 3,706,914 | 12/1972 | Van Buren | 315/292 X |
| 3,763,394 | 10/1973 | Blanchard | 315/297 X |
| 3,805,096 | 8/1974 | Hamilton | 315/292 X |
| 3,946,273 | 3/1976 | Goodard | 315/297 |
| 4,057,751 | 11/1977 | Bonsignore et al. | 315/292 X |

OTHER PUBLICATIONS

Ferenstat Model FR-105, from TASA (Touch Activated Switch Arrays, Inc.).
The Touch Postentiometer, from LDF, Semiconductor, Inc.

Primary Examiner—Edward J. Wise
Attorney, Agent, or Firm—Patrick J. Barrett

[57] ABSTRACT

The position of an operator's finger on a transducing surface is used for controlling the level of utilization devices including theater lights controlled by an automated theater light control system. The transducing surface, which may be either an analog or a digital device, is elongated in shape and is immediately adjacent to an elongated display having individual light-emitting devices to indicate the level of the utilization device being controlled. Circuitry connected to the transducing surface produces a first signal to indicate when an operator's finger is present on the transducing surface, and it produces a second signal to indicate the position of the operator's finger on the transducing surface. The second signal is supplied to the display, and the first and second signals are supplied to the utilization devices.

31 Claims, 14 Drawing Figures

POSITION SENSING AND INDICATING DEVICE

BACKGROUND OF THE INVENTION

1. Field of the Invention

This invention relates to devices for controlling and varying the level of theater lights and the like.

2. Description of the Prior Art

The brightness or level of theater lights at one time was controlled manually by adjusting individual rheostats or autotransformers for each light or bank of lights. As theatrical programs became more sophisticated, automated light control systems were developed to fade lights in or out according to a predetermined program or time sequence. However, because performances often vary depending on the performers, audience, etc., it was necessary to provide for manual override so the fades could be sped up or slowed down as the performance required.

Typical prior art automated lighting systems included a potentiometer for each light or bank of lights driven by a motor through a slip clutch. When the program called for fading a light the motor would be energized and turn the potentiometer at a constant rate. If the operator desired to change the rate, he simply took hold of the moving potentiometer knob and turned it faster or slower. This system had the disadvantages of being bulky, clumsy and unreliable due to the large number of mechanical components.

SUMMARY OF THE INVENTION

According to a preferred embodiment of the present invention, a device for controlling the level, the fade-in and fade-out of theater lights and the like can be made with essentially no moving parts. The device, called a touchplane herein, has a flat, elongated transducing surface and a parallel array of visible display devices. The relative level of the light or other utilization device being controlled by the touchplane is indicated by the visible display. Typically, one end of the touchplane surface represents 0% relative level; and the other end, 100%.

When an operator places his finger on the transducing surface, the position of the operator's finger is sensed by the touchplane and the level of the light being controlled is adjusted to correspond to the level represented by the position of the operator's finger. If the operator slides his finger along the transducing surface, the level of the light will vary accordingly; and this fact will also be indicated by the visible display.

The touchplane may be built in either analog or digital form, depending on the requirements of the utilization device. An analog embodiment includes a resistive network that has a variable impedance depending on the presence and position of the operator's finger. Circuitry is provided to detect this variable impedance and to produce an analog signal that is representative of the impedance and, hence, of the position of a finger on the transducing surface. This analog signal may, in turn, be converted to a digital signal if desired.

A digital embodiment uses a linear array of switches that is connected to a digital scanner. The scanner determines when a switch in the array is closed and produces a signal indicating which switch has been closed, as well as the fact that the operator's finger is on the transducing surface.

A visible display for use with either of the embodiments discussed above comprises a row of lights such as light-emitting diodes (LEDs) situated alongside the transducing surface. An LED is illuminated next to whatever portion of the transducing surface the operator's finger touches, and it stays illuminated after the finger is removed, to indicate the last position of the operator's finger and the current level of the light being controlled.

The touchplane is ideal for use in an automated theater light control system. Because the output of the touchplane is (or can be ) digital, it can be interfaced easily with a digital computer used to control the lights. While the lights are under the control of the computer, in accordance with a program stored therein, the level of the lights can be indicated on the visible display of the touchplane assigned to a particular light. If the operator desires to change the rate of a fade, he simply places his finger on the transducing surface and the level of the light is then controlled by the position and movement of his finger rather than the program in the computer.

The touchplane also produces a separate signal, called Finger Down herein, to indicate the fact that an operator's finger has been placed on the transducing surface. When the touchplane is being used in an automated system, this Finger Down signal can be used to take a particular light out of the automatic control program as soon as the operator's finger touches the transducing surface, without having to use a separate control for this purpose.

Another advantage of the touchplane is that, since it is a digital device, it can easily be assigned to control different lights as required by the operator. As compared with a potentiometer controlled by a motor through a slip clutch, the touchplane is much more compact, more reliable, more convenient to use and more in harmony with contemporary styling of theater light control panels.

DETAILED DESCRIPTION OF THE PREFERRED EMBODIMENT

Figure 1:
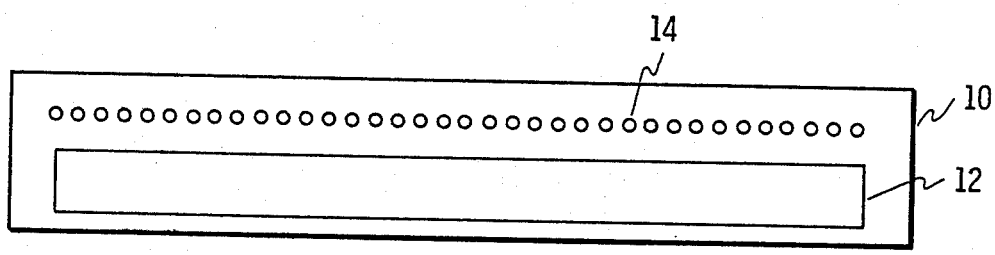
FIG. 1 shows a plan view of a touchplane according to a preferred embodiment of the present invention.

FIG. 1 shows a plan view of a preferred embodiment of the position sensing and indicating device 10 which, as mentioned above, will be referred to herein as a "touchplane". Touchplane 10 has an elongated transducing surface 12 that will be described in greater detail below. Alongside of transducing surface 12 is a row of visible indicators 14 such as light-emitting diodes.

Figure 2:
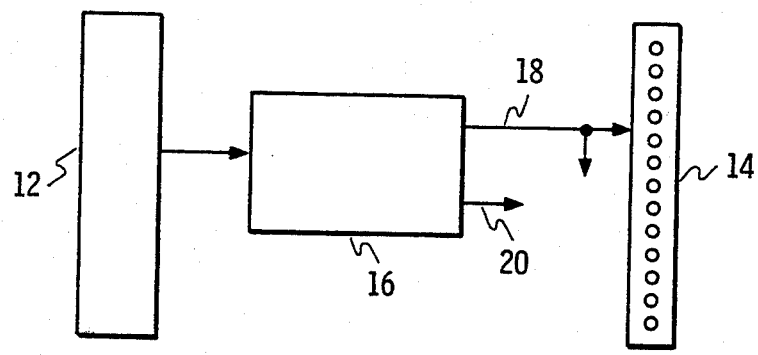
FIG. 2 shows a simplified block diagram of a touchplane according to a preferred embodiment of the present invention.

The simplified block diagram of FIG. 2 shows that transducing surface 12 is connected to a circuit 16 which produces an output signal on output 18 that indicates the position of an operator's finger on the transducing surface. Circuit 16 also produces an output signal on an output 20, called herein the "Finger Down" signal, to indicate the presence of an operator's finger on the transducing surface. Output 18 is connected to visible indicators 14 and is also available for connection to other utilization devices, as will be more fully described below. In response to the signal on output 18, one of the indicators will light up to show the position of the operator's finger. Circuit 16 may include a memory element to remember the last position of the operator's finger after the finger has been removed, so that the corresponding indicator will remain illuminated until the operator places his finger on the transducing surface again in a different place.

Figure 3:
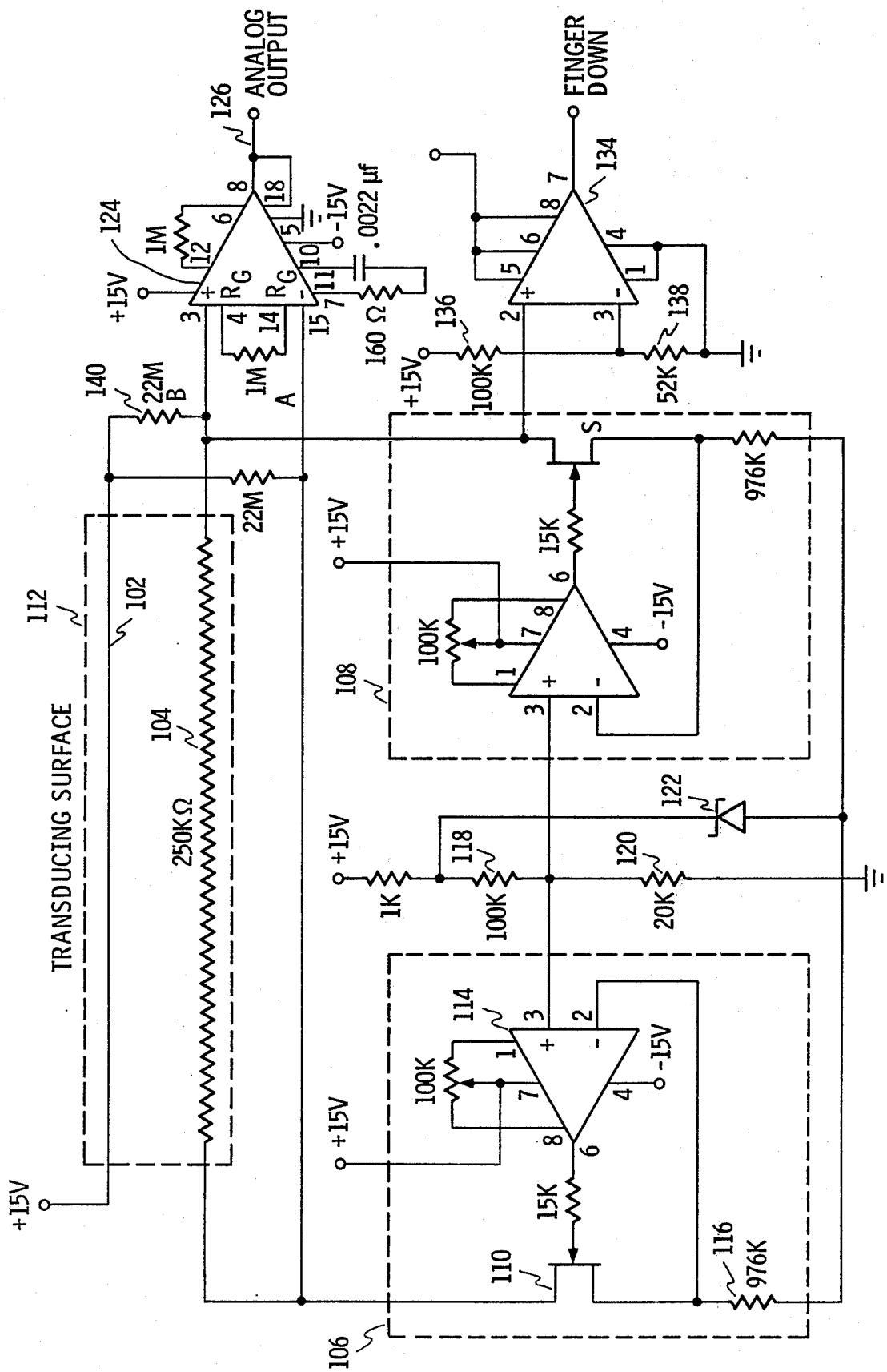
FIG. 3 shows a schematic diagram of a preferred embodiment of the touchplane.

FIG. 3 shows a schematic diagram of an embodiment of the touchplane that uses an analog transducer to indicate the position of the operator's finger. Transducing surface 112 comprises a metal strip 102 and conductive plastic strip 104 arranged in parallel along the length of the transducing surface. The metal and the conductive plastic are chosen such that the resistance of the plastic is much higher than that of the metal. For example, in the preferred embodiment, the resistance of the strip of metal is less than 1 ohm while that of the conductive plastic is 250,000 ohms. In the drawings, all resistances are indicated in ohms, where "K" signifies thousands and "M", millions.

Conductive plastic suitable for use in this embodiment is available commercially from Waters Manufacturing Company. The metal strip is preferably tin or gold plated to reduce or eliminate corrosion and to maintain its conductivity.

Identical current pumps 106 and 108 are connected to each end of conductive plastic strip 104. Current pump 106 comprises a Model MPF 4392 field-effect transistor (FET) 110 and a model LM 312H operational amplifier 114. The drain electrode of the FET is connected to one end of the conductive plastic strip and the source electrode is connected to ground through a 976,000 ohm resistor 116. The output of operational amplifier 114 is connected to the gate electrode of FET 110 through a resistor to provide a control voltage that establishes, together with resistor 116, the amount of current pumped by the circuit. In the particular example shown, the circuit values have been chosen so that the current pump pumps 2 microamps ($\mu$A).

A fixed voltage is provided to the noninverting (+) input of operational amplifier 114 by a voltage divider comprising resistors 118 and 120 connected across a 12 volt Zener diode 112. As can be seen from FIG. 3, current pump 108 has the same elements and functions in the same manner as current pump 106.

Each end of conductive plastic strip 104 is also connected to one of two inputs to a Model LF352D differential amplifier 124. An output 126 of differential amplifier 124 forms the Analog Output of the circuit shown in FIG. 3.

The circuit of FIG. 3 operates as follows. Metal strip 102 and conductive plastic strip 104 are placed close enough together so that an operator's finger will contact both of them when it is placed on the transducing surface.

Figure 4:
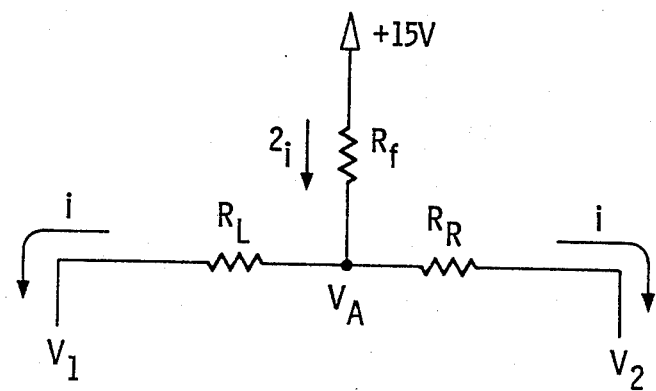
FIG. 4 is a schematic diagram illustrating the operation of a portion of the circuit shown in FIG. 3.

For the following discussion, the D.C. resistance of the human finger will be assumed to be less than 2,000,000 ohms. FIG. 4 shows a schematic diagram of the circuit that results when a finger is placed on the transducing surface. Here $R_f$ designates the resistance of the finger; $R_L$, the resistance of the plastic strip to the left of the finger; $R_R$, the resistance of the plastic strip to the right of the finger; $V_1$, the voltage at the left end of the plastic strip; $V_A$, the voltage where the finger is in contact with the plastic strip; $V_2$, the voltage at the right end of the plastic strip; and i, the current pumped by each current pump. Using a supply voltage of 15 volts, the following equations can then be derived from FIG. 4 using Ohm's law:

$$V_A = 15v - R_f(2i)$$

$$V_1 = V_A - iR_L = 15 - R_f(2i) - iR_L$$

$$V_2 = 15 - R_f(2i) - iR_R$$

$$\text{and } V_1 - V_2 = i(R_R - R_L)$$

If the total resistance of the conductive plastic strip is represented as $R_T$, then:

$$R_R + R_L = R_T = 250K\Omega$$

or $$R_R = 250K\Omega - R_L.$$

Noting that $i = 2\mu A$ and substituting the values for i and $R_R$ into the equation for $V_1$ above yields:

$$V_1 - V_2 = (2\mu A)(250K\Omega = 2R_L).$$

The points at which $V_1$ and $V_2$ are measured in FIG. 3 are denoted as points A and B respectively, the inputs to differential amplifier 124. It is clear from the last equation that the difference voltage $V_1 - V_2$ is directly proportional to $R_L$ and thus proportional to the position of the operator's finger on the transducing surface. At the same time it should be noted that the difference voltage is independent of the resistance $R_f$ of the operator's finger. Differential amplifier 124 separates the differential signal $V_1 - V_2$ from the common mode signal and also acts as a buffer.

Figure 5:
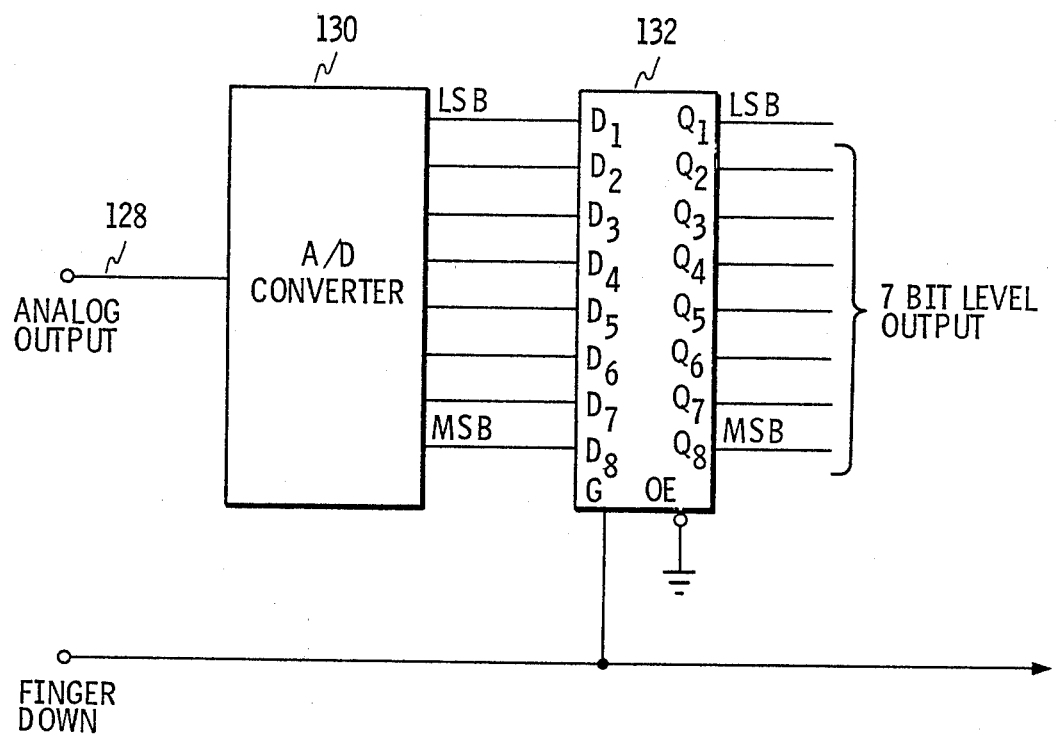
FIG. 5 shows a block diagram of an analog-to-digital converter.

The Analog Output signal on output 126 may be converted to a digital signal, if desired, in an analog-to-digital converter as shown in FIG. 5. An input 128 of a standard 8-bit analog-to-digital (A/D) converter circuit 130 is connected to output 126. The A/D converter produces an 8-bit digital signal representative of the Analog Output signal on its eight binary outputs. These binary outputs are in turn connected to the inputs of a Model SN74LS373N 8-bit latch 132 which stores the digital output of A/D converter 130 when the operator's finger is removed from the transducing surface. In the illustrated preferred embodiment, as discussed in further detail below, one out of eighty possible positions for the operator's finger on the transducing surface is indicated, so only 7 of the 8 outputs from latch 132 are used.

The circuit of FIG. 3 also produces a Finger Down signal to indicate when an operator's finger is actually in contact with the transducing surface. This signal is produced by a Model LF311H comparator 134 which has one input connected to point B; and the other input, to a reference voltage produced by a voltage divider comprising resistors 136 and 138. As the oerator's finger is removed from the transducing surface, the voltage at point B will drop since current pump 108 will maintain a constant current flowing through that node.

Because the current is supplied through a 22MΩ resistor 140 after the finger is removed from the transducing surface, the voltage drop across resistor 140 is higher than that across the operator's finger and conductive plastic strip 104. The voltage drop at point B is detected by comparator 134 and converted to a TTL level signal "Finger Down". Finger Down is about 5 volts (i.e., a logical "high") when a finger is on the transducing surface and is about zero volts (a logical "low") when there is no finger.

This Finger Down signal is applied to an input labeled G on latch 132 (FIG. 5) to cause latch 132 to store A/D converter 130 output when the operator's finger is removed. The Finger Down signal may also be used by other utilization circuits when it is desirable to know when an operator is changing a level setting using the touchplane.

Figure 6:
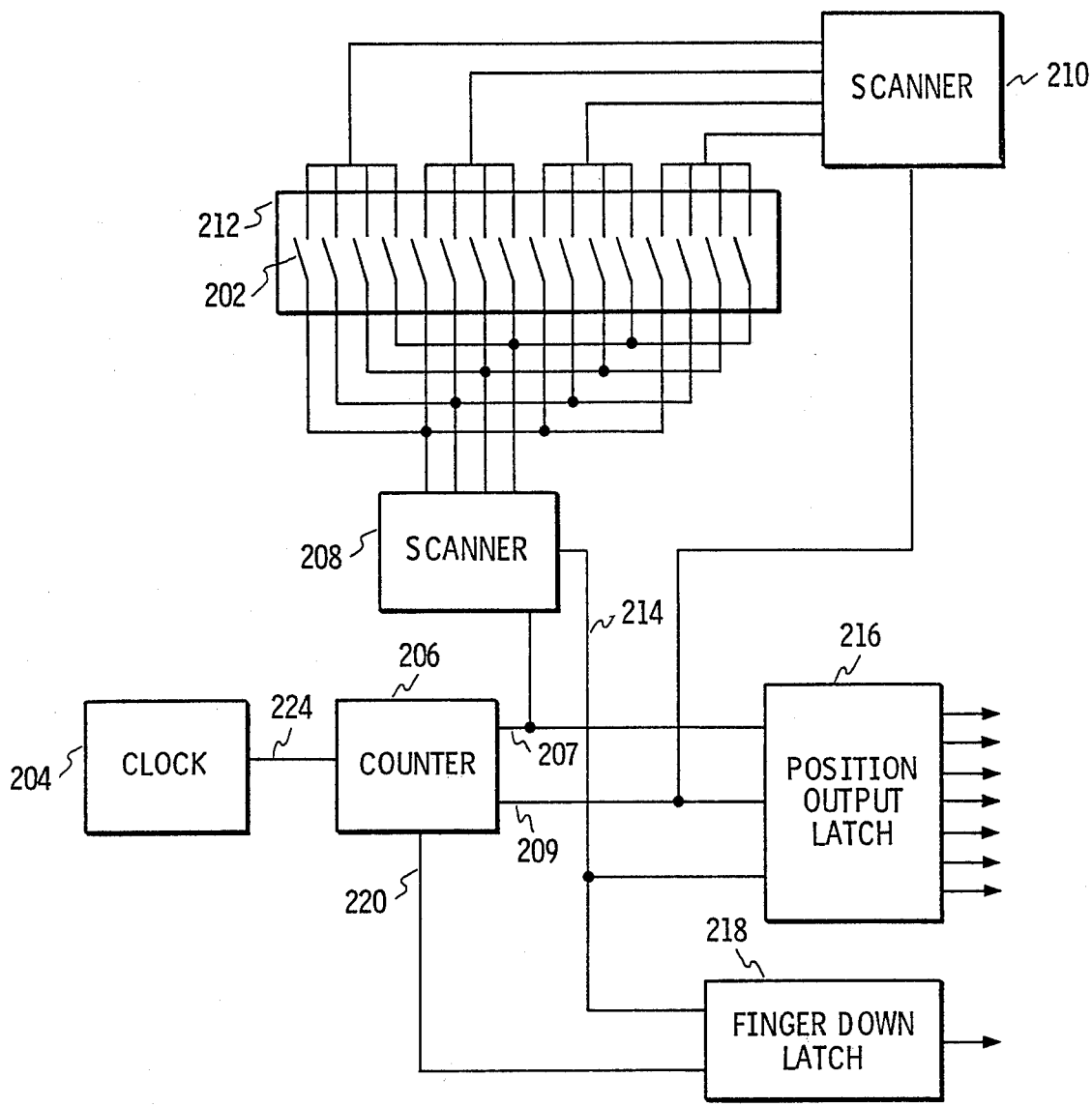
FIG. 6 is a block diagram of another preferred embodiment of the touchplane.

FIG. 6 shows a block diagram of a preferred embodiment of the touchplane with a completely digital input section. In this embodiment a transducing surface 212 comprises a linear array of closely spaced momentary contact normally open switches 202. Preferably these switches are of the membrane or micro-motion type such as those sold by Centralab under the name "Monopanel".

Figure 7:
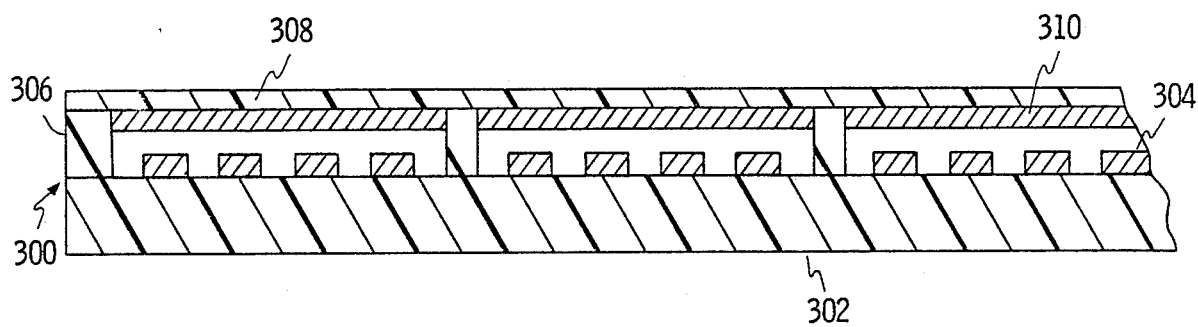
FIG. 7 is a cross-sectional view of a switch array.

A cross-sectional view of a portion of such a switch array 300 is shown in FIG. 7. The array has a lower insulating layer 302 that supports a plurality of isolated contacts 304 which may be constructed using known printed circuit techniques. An insulative separator layer 306 is placed on layer 302 to support an upper flexible insulating layer 308. Layer 308 also has a plurality of isolated contacts 310 similar to contacts 304. Separator layer 306 has a number of apertures aligned with each contact 310 to permit contact 310 to make electrical contact with one of contacts 304 when pressure is applied to the top of layer 308 by an operator's finger.

As shown in FIG. 7, several lower contacts 304 are grouped together for one upper contact 310 to simplify the matrix connections and also to provide close switch contact spacing so that a small movement of an operator's finger along the top surface of layer 308 will result in a different switch being closed. Other arrangements, of course, are possible, and one top contact could be provided for each lower contact. Connection to each of the contacts 304 and 310 to external circuitry can be made by conventional means such as printed circuit traces, plated through holes in layer 302, etc. As shown in FIG. 6, the transducer surface 212 has only 16 switches for the purposes of illustration; however, it will be understood that any number of switches can be used depending on the length of the touchplane and the amount of resolution desired. A timing circuit or clock 204 generates a 15 kiloHertz (kHz) timing signal to drive the rest of the circuitry. The output of clock 204 is connected to an input of a counter 206 which, in turn, is connected to two scanners 208 and 210 by outputs 207 and 209, respectively. Scanner 210 has outputs connected to first groups of adjacent switch contacts. In response to an output signal on output 209, scanner 210 makes connection with these groups one at a time.

Scanner 208 has outputs that are connected to second groups of switch contacts comprising one contact from each of the first groups. In response to an output signal on output 207, scanner 208 makes connection with each second group of contacts one at a time. As explained in more detail below, the output signals from counter 206 cause the scanners, taken together, to connect to one switch contact at a time. When a switch contact to which both scanner 208 and 210 are connected is closed, scanner 208 produces a signal on output 214.

Output 214 is connected to a position output latch 216 to which outputs 207 and 209 are also connected. When a signal on output 214 indicates that a switch is closed, position output latch 216 stores the count that appears on outputs 207 and 209. The number of the switch indicates which switch is closed and therefore the position of the operator's finger.

A Finger Down latch 218 is also connected to output 214 as well as to an output 220 of counter 206. When a switch 202 is closed, Finger Down latch 218 also produces an output signal to indicate when an operator's finger is present on the transducing surface.

Figure 8:
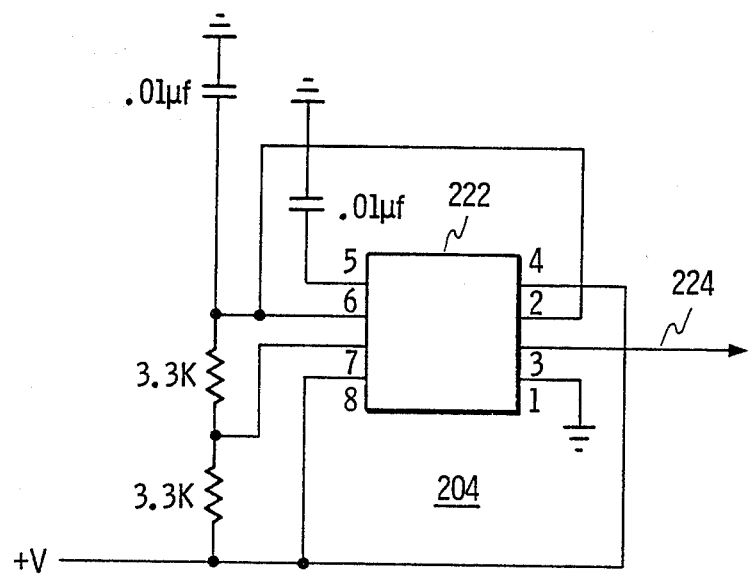
FIGS. 8, 9 and 10 show a schematic diagram of the embodiment of FIG. 6.

FIG. 8 shows a schematic diagram of clock 204 which comprises a standard Model LM555 integrated circuit timer 222. The 15 kHz timing signal appears on output line 224.

Figure 9:
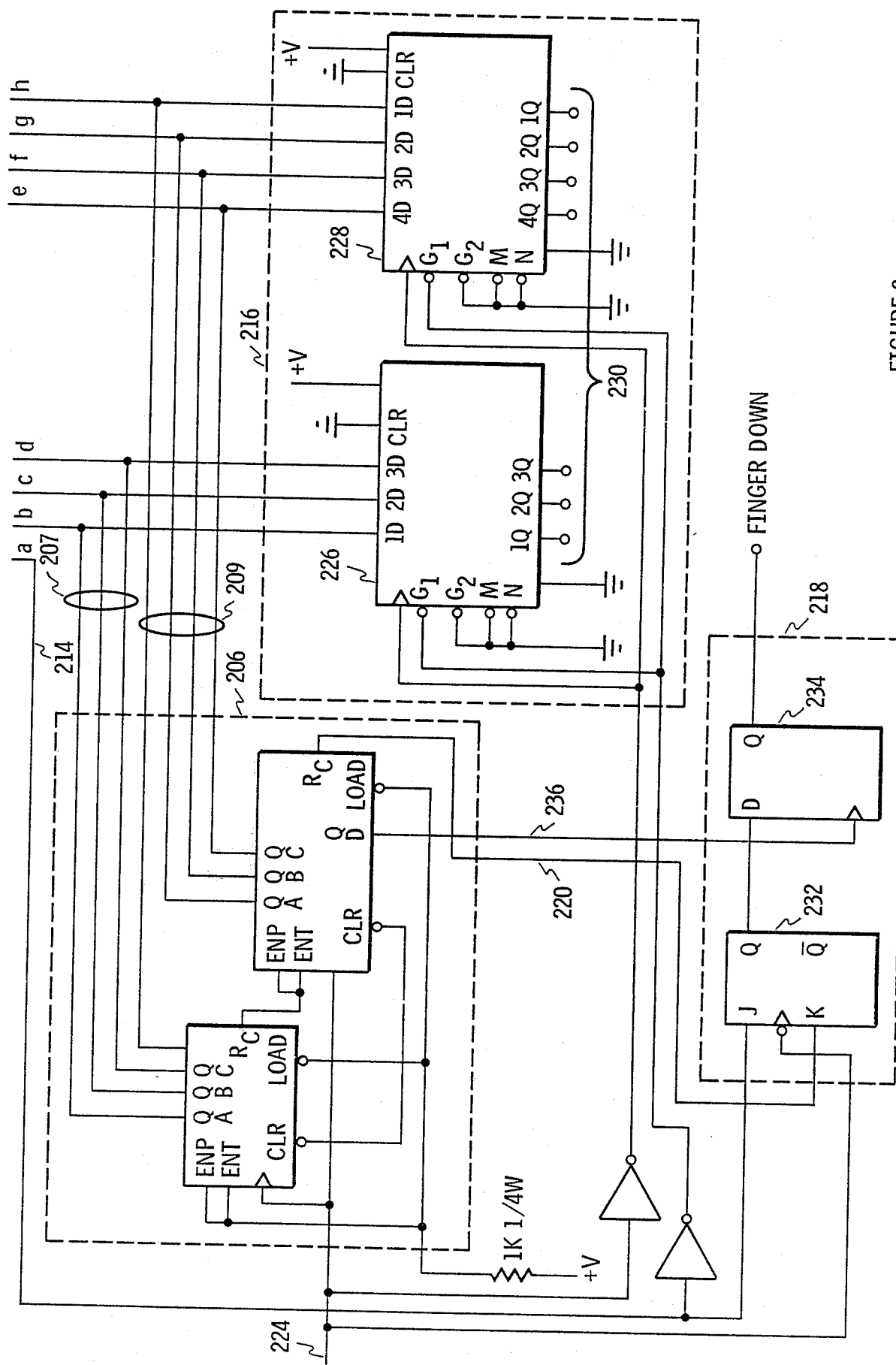
Figure 10:
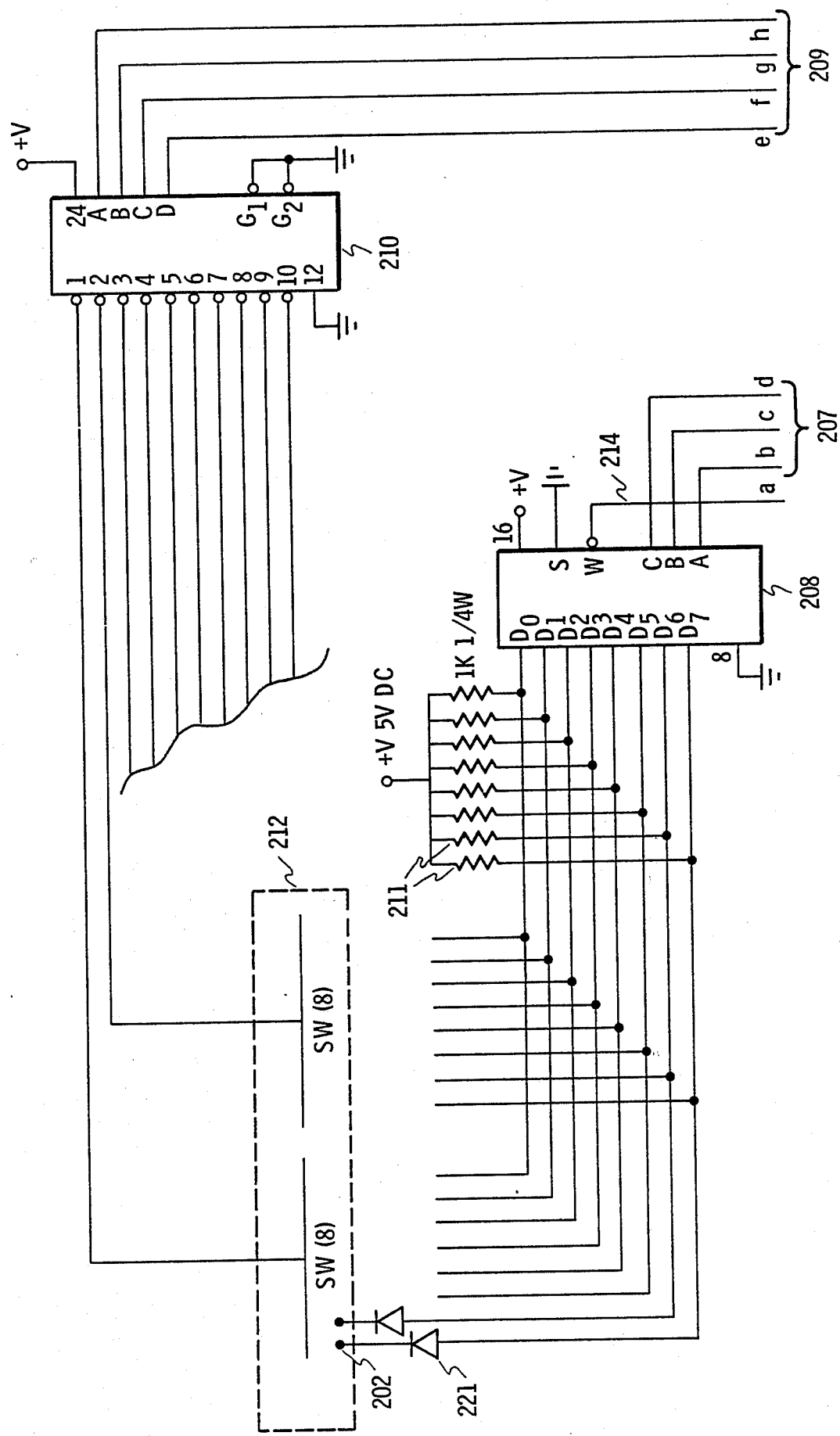

FIG. 9 shows a schematic diagram of counter 206, position output latch 216 and Finger Down latch 218; and FIG. 10 shows a schematic diagram of transducer surface 212, and scanners 208 and 210. In this embodiment, transducer surface 212 is a linear array of 80 momentary contact normally open switches 202. For scanning purposes the switches are grouped together electrically in 10 groups of 8 switches each, with all of the upper contacts of the switches of a group being connected to one of the 10 outputs of scanner 210. For the sake of clarity and simplicity, only a couple of the switch contacts have been shown in FIG. 10, however it will be understood that each of the switches and groups of switches is connected as shown. As in FIG. 6, the lower contact of one of the switches from each group is connected, together with the lower contacts of the corresponding switch in each of the other groups, to one of the 8 outputs of scanner 208.

Counter 206 comprises two cascaded 4-bit Model SN74161 counters to produce an 8-bit counter, only 7 bits of which are used for driving the scanners. The outputs carrying the least significant 3 bits from the counter comprise output 207. This output is connected to scanner 208 which comprises a Model SN74151 integrated circuit scanner. The most significant 4 of the 7 bits are on output 209. Output 209 is connected to scanner 210 which comprises a Model SN74159 integrated circuit scanner. With each pulse from clock 204, the count from counter 206 increments by one until the maximum count is reached and then the counter resets by incrementing to zero.

A closed switch 202 is detected and indicated as follows. Each of the outputs of scanner 208 is held at a high level through a resistor 211 connected to +5 volts. Scanner 210, in response to the incrementing count from counter 206, successively connects each of its 10 outputs to ground (low). Since scanner 208 receives the 3 least significant bits from counter 206, it scans repetitively through the eight switches in each group while scanner 210 scans through the 10 groups. If, for example, switch three in group two (or switch 11 out of 80) is closed, the third output of scanner 208 (labeled $D_5$)

will be pulled low when scanner 210 is connected to the second group. On the third increment, scanner 208 will detect this low and produce an output signal on output 214 (pin 6) of scanner 208. Diodes 221 are connected to each of the switches 202 so that there will be no "phantom" switch closures in which a switch closure in one group is detected when another group is being scanned.

As discussed above, output 214 is connected to position output latch 216, which comprises two Model SN74173 latches 226 and 228. Latch 226 is connected to output 207 and latch 228 is connected to output 209, so that the current state of counter 206 is constantly being supplied to the inputs of the latches. When a high signal appears on output 214 in response to a switch being closed, latches 226 and 228 store the number appearing on outputs 207 and 209 which identifies the closed switch.

In order to prevent race conditions and allow some settling time between the incrementing of counter 206 and the storing of a number in latches 226 and 228, counter 206 is incremented on the positive-going edge of the clock pulse and the latches only act on the negative-going edge. Once the number of a closed contact is stored in latches 226 and 228, it appears on outputs 230 until a new, different switch is closed.

The Finger Down signal is produced by a Model SN74LS73 flip-flop 232 and a Model SN74LS74A flip-flop 234. At the beginning of each scan, flip-flop 232 is reset by the signal on ripple carry output 220 which is connected to the K input of flip-flop 232. If a closed switch is detected during a scan, flip-flop 232 is set by the signal on output 214 which is connected to the J input of flip-flop 232. At the completion of the scan the Finger Down information in flip-flop 232 is transferred to flip-flop 234 in the following manner. The Q output of flip-flop 232 is connected to the D input of flip-flop 234 and the clock input of flip-flop 234 is connected to the most significant bit ($Q_D$) output 236 of counter 206. When the signal on output 236 goes high at the end of a scan, the contents of flip-flop 232 are transferred to flip-flop 234, and a high signal appears therefore on the Q output of flip-flop 234 if a switch contact was closed. This signal on the Q output of flip-flop 234 is the Finger Down signal.

Due to the high frequency of the clock signal, all of the foregoing events take place very quickly, the total scan taking only about 17 milliseconds. This total scan time, of course, can be increased or decreased, as required, by proper selection of the clock frequency and compatible circuitry.

While one form of switches has been described above for use in the touchplane, it will be understood that other forms of touch-sensitive devices can be used. For example, commercially available capacitive-type touch switches can be used together with commercially available interface circuits for these switches such as the AMI Model S9263. Alternatively, resistance-type switches where the resistance of the operator's fingertip actuates the switch can be used.

Figure 11:
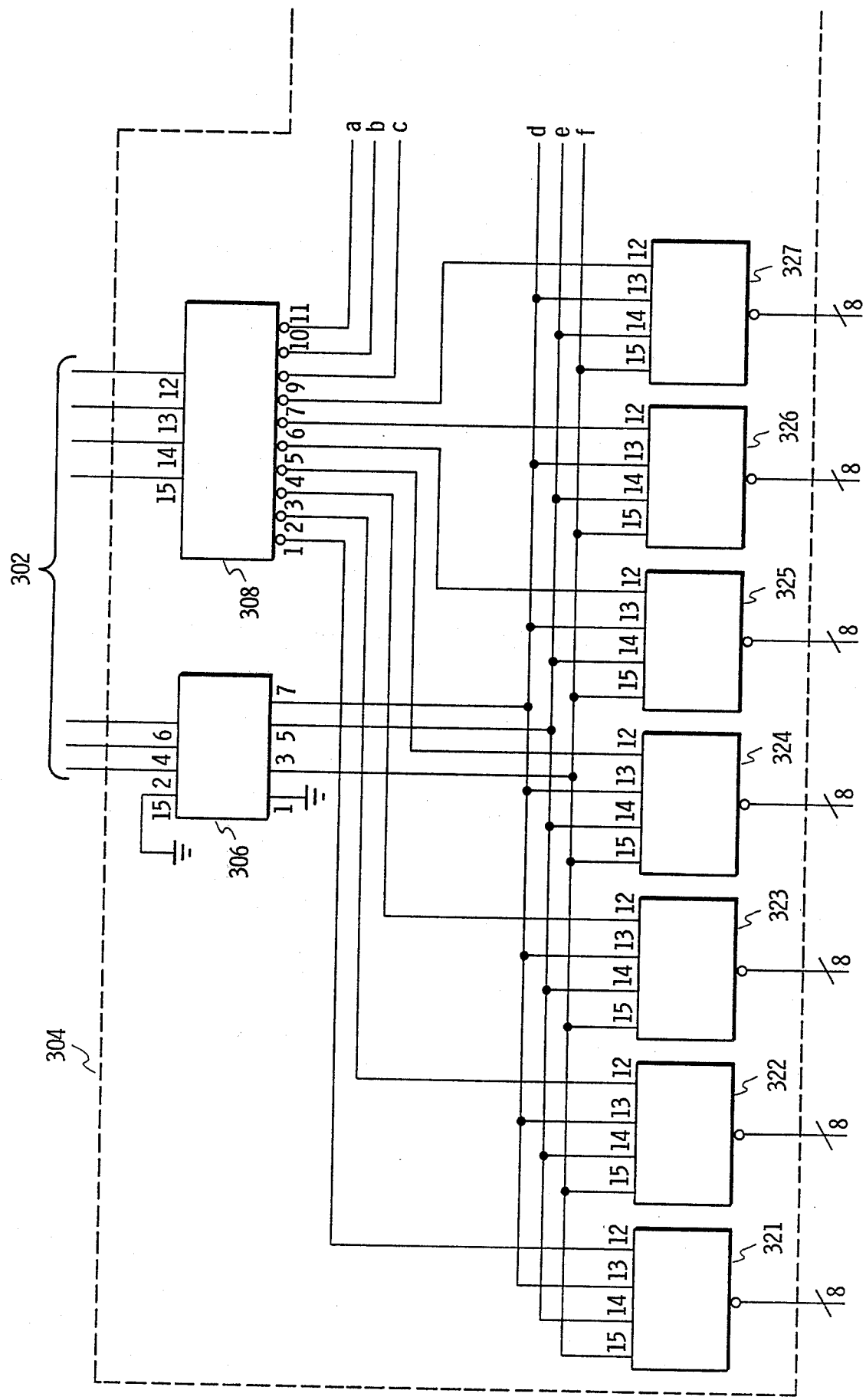
FIGS. 11 and 12 show a schematic diagram of an output section for the touchplane.
Figure 12:
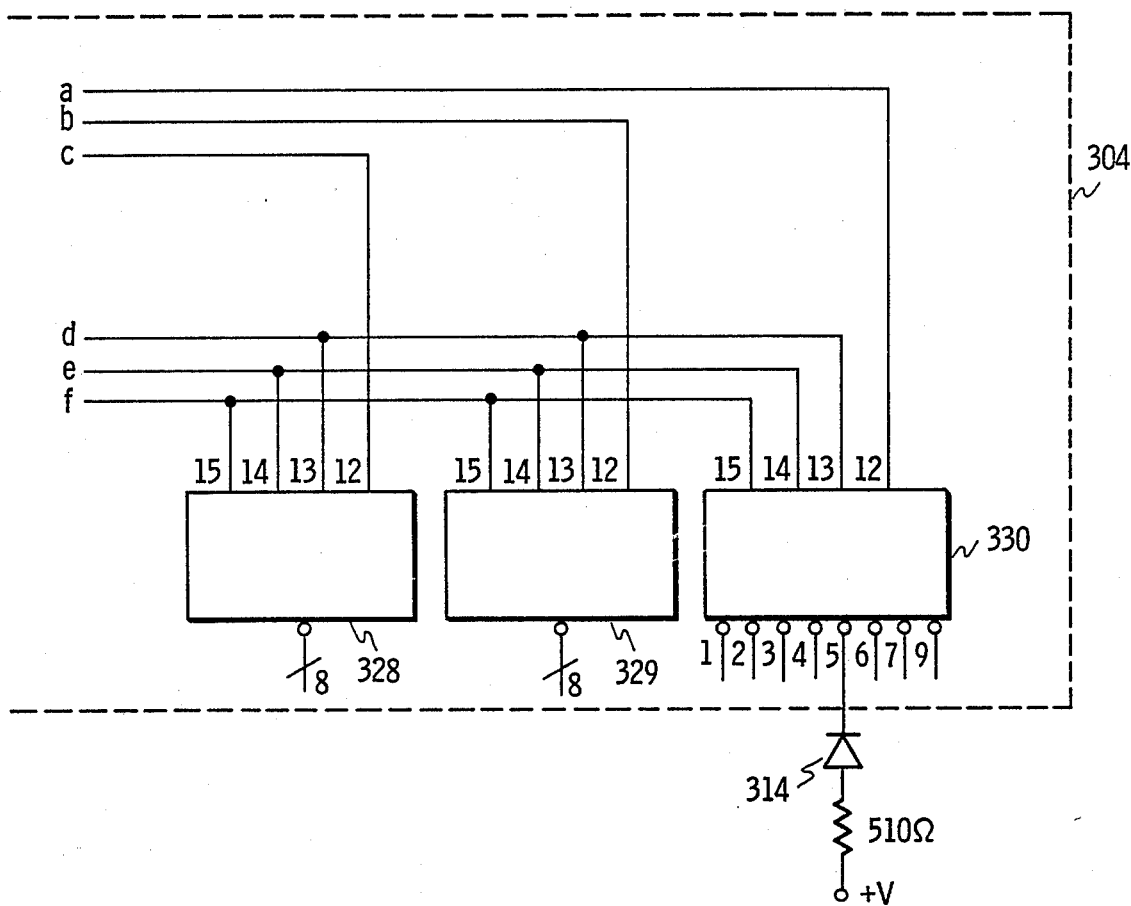

FIGS. 11 and 12 show a schematic diagram of a preferred embodiment of an output section for the touchplane. An input 302 is connected to receive the output of either position output latch 216 (see FIG. 9) or latch 132 (see FIG. 5). The seven lines comprising input 302 are connected to a 1-out-of-80 decoder 304. The least significant 3 bits are supplied to an integrated circuit Model SN74365A buffer 306 which in turn is connected to the three least significant bit inputs of ten integrated circuit Model SN74145 four-bit decoder/driver circuits 321–330. The four most significant bits on input 302 are supplied to an integrated circuit Model SN7442A binary-coded decimal to binary decoder 308. The 10 outputs of decoder 308 are each connected to the most significant bit input of one of the decoder/driver circuits 321–330.

Each of the decoder/driver circuits has 8 outputs, each of which is connected to a light-emitting diode (LED). Although only one LED 314 is shown in FIG. 12, it will be understood that each output of a decoder/driver circuit is connected to an LED in a like manner. When a signal appears on input 302, an output of one of the decoder/driver circuits goes from high to low, permitting one of the LEDs to be forward biased and thus emit light. Although the use of LEDs has been disclosed here, other types of visible indicators can be used such as incandescent lights, liquid crystals, electroluminescent displays, cathode-ray tubes, gas discharge tubes, etc.

There are many possible uses for the touchplane in addition to the control of theater lights. The touchplane can be used in place of the paddle controls used in TV amusement games or it can be used as a control for the positioning of a machine tool or the station selector in a radio or a television. Analogously to its use with theater lights, it can be used also in a sound system control panel such as those used in recording and broadcast studios. Furthermore, the touchplane can be used to vary a rate as well as a position. For example, it can be used to change the rate at which a machine tool is moving or the rate at which theater lights are fading.

In some applications, particularly where the operator has visual or aural feedback from the device being controlled, it may not be necessary to have a visible display immediately adjacent to the transducing surface. For example, if the touchplane is used with a TV amusement game, the operator would receive visual feedback from the TV cathode-ray tube. Likewise, a theater light or machine tool operator could observe the level of the lights or the position of the tool without the visible display, although the control available to the operator would probably be less precise.

Figure 13:
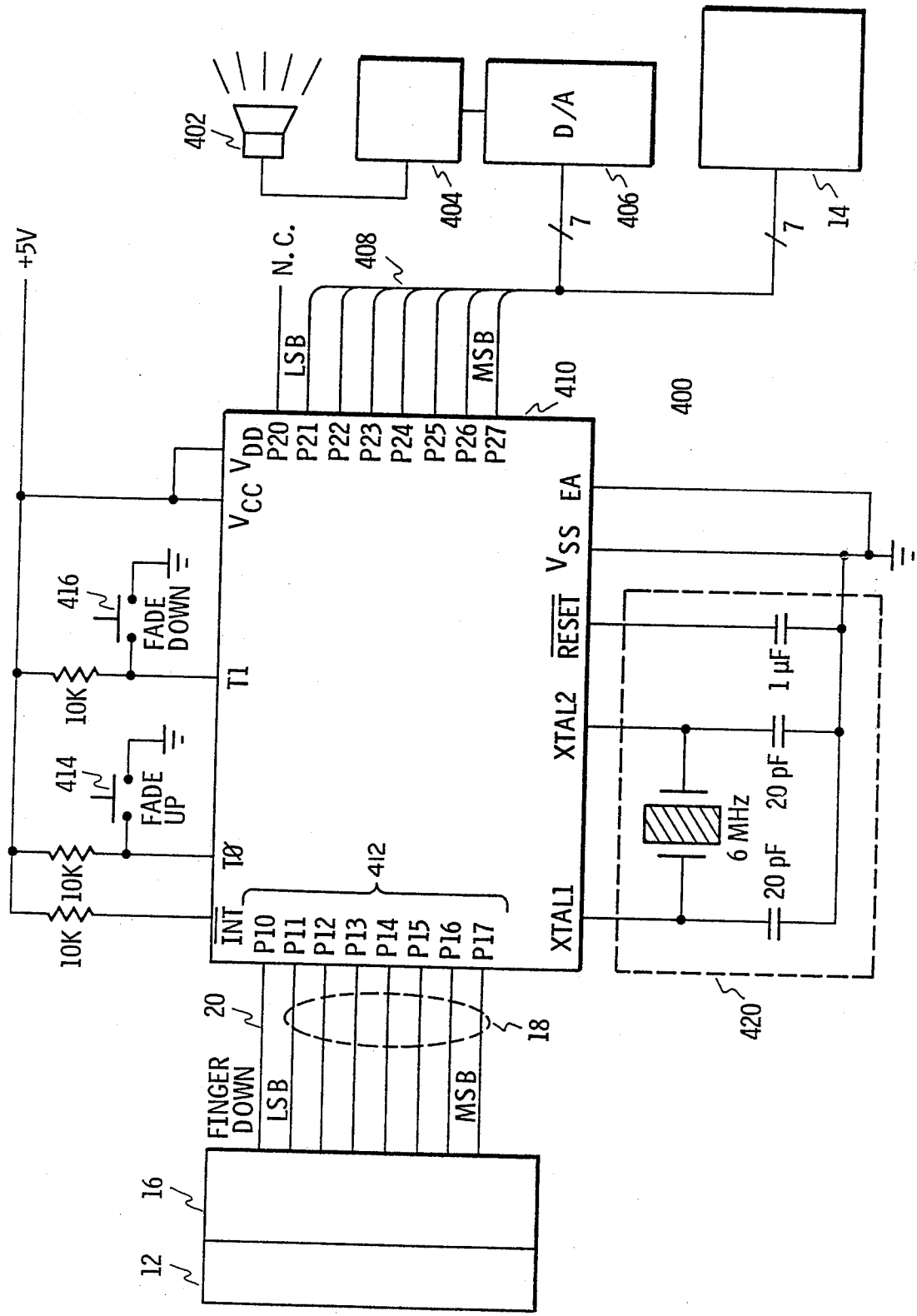
FIG. 13 is a block diagram of an automated light control system using the touchplane.

A specific example of the use of the touchplane in a computer-controlled theater lighting system will now be described, although only a very simplified system will be shown for the purposes of explanation. FIG. 13 shows a schematic diagram of a computer-controlled lighting system 400 comprising a light 402 connected to a commercially available voltage-controlled power source 404. Power source 404 is connected to a commercially available digital-to-analog (D/A) converter 406.

D/A converter 406 and visible indicators 14 are connected to an output 408 of a digital computer 410. The digital computer used in this embodiment is an Intel Model 8748 microprocessor which includes a central processor as well as eight-bit input and output ports. It will be understood by those skilled in the art that other general purpose digital computers can also be used.

Touchplane transducing surface 12 and circuit 16 are connected to an input 412 of computer 410. As can be appreciated from the foregoing description of the preferred embodiment of the touchplane, either embodiment can be used as an input device to the computer in FIG. 13. Input 412 receives the 7 bits of position information on pins P11 through P17 and the Finger Down signal on pin P10. Since only 7 bits of position or level information are used in this embodiment, output 408 uses only the 7 most significant bits available from the 8-bit computer output port.

The computer also has two additional switches connected to it: switch 414 to initiate a "fade up" operation and switch 416 to initiate a "fade down" operation. A fade up operation increases the level of the light at a steady rate and a fade down operation decreases the level of the light at a steady rate. Although fade up and fade down have been illustrated here only as manual controls, these operations can also be called for by a program stored in computer memory. To complete the circuit for the computer, timing components 420 for the computer are connected to the appropriate inputs.

Figure 14:
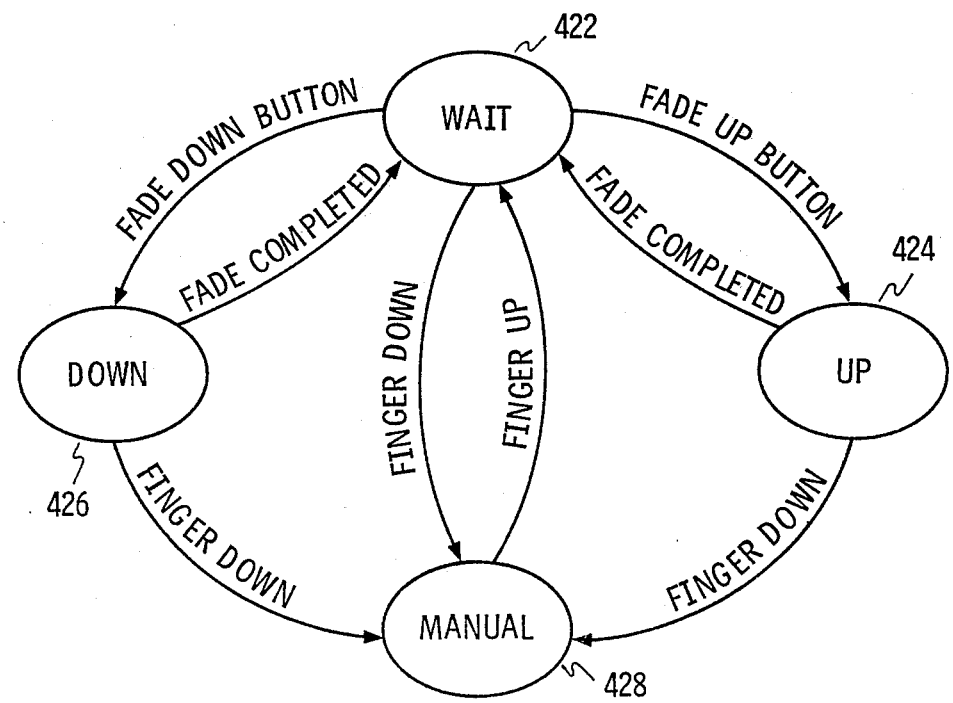
FIG. 14 is a state diagram of a computer program for use in the system of FIG. 13.

FIG. 14 shows a state diagram of a simple computer program for use in computer 410 to provide computer-controlled fades and a manual override. Normally, the computer is in a "wait" state 422 and the level of light 402 is determined by the current value on output 408. When the operator momentarily depresses switch 414, the computer will go to an "up" state 424 and the level of the light will be steadily increased until it is at maximum brilliance. The computer will then return to the wait state. Likewise, if switch 416 is depressed, the computer will go to a "down" state 426 and the light will be faded down until it is extinguished. Once again, the computer will return to the wait state when the fade down is completed.

If, at any time, the operator places his finger on the touchplane, the computer will immediately jump to a "manual" state 428 in response to the Finger Down signal. The level of the light will then be controlled by the touchplane. So long as the operator's finger remains on the touchplane, the level of the light will depend solely on the position of his finger. As soon as the operator removes his finger and the Finger Down signal goes low, the computer will return to the wait state, and the level of the light will remain at the level determined by the position of the operator's finger when he removed it from the touchplane. Thus, the operator can watch the process of a fade on visible indicators 14 and can interrupt a fade any time he desires to increase or decrease the rate, as well as setting a particular fixed level for the light.

A detailed computer program suitable for accomplishing the foregoing using the illustrated computer is given in Appendix A. In this program the rate of fade has been selected to provide 100% fade in about 30 seconds. It will be understood by those skilled in the art that the touchplane can be used with more complex computer systems and programs without departing from the spirit and scope of this invention.

FIGS. 15 through 19 show a flow diagram of the illustrative program in Appendix A. As shown in FIG. 15, the program starts by jumping to label BEGIN 502 (SEQ 8 in Appendix A), where the program is initialized at step 504, by setting the current output levels to zero. The program then continues to label WAIT 506 (SEQ 11), where it enters the wait state (also indicated by 422 on FIG. 14). In this state, the program executes a continuous loop searching for alternative actions. If the operator desires to control the dimmer through the touchplane, he would place his finger on the transducing surface, generating the finger down signal. This signal would be detected by the program in decision block 508, causing the program to jump to manual mode, as indicated by block 510. If the operator desired an automatic fade up, he would press the up button 414 in FIG. 13. This button push would be detected in decision block 512, causing the program to jump to the fade up state as shown by block 514. If the operator desired an automatic fade down, he would press the down button 416 in FIG. 13. This button would be detected in decision block 516, causing the program to jump to the face down state as shown by block 518.

FIG. 16 illustrates the flow of control in Manual mode. This mode starts at label MANUAL 520 (SEQ 18), where the first action is to wait for 16 milliseconds (ms) in step 522. After this delay, the finger down signal is again checked in block 524 to confirm that the input was not caused by a spurious input or a noise spike. If the finger is still down, the current touchplane output is transferred to the dimer output and is also stored in the computer memory at block 526. The flag is then cleared in block 528, to indicate that the finger was down and the program loops to the beginning of manual mode. It can be seen here that as long as the finger remains down, the program will stay in this loop and the dimmer output will follow the current touchplane output.

If the finger is detected up in block 524, the program checks the flag to see if this was the second time in a row that the finger was up in block 530. If so, the program exits manual mode and goes back to the wait mode as indicated by block 532. If the finger is up for the first time, the program sets the flag in block 534, and loops to check if the finger is still up 16 ms later. Requiring a second input to confirm that the finger is up avoids spurious responses due to noise spikes.

FIG. 17 illustrates the flow of control in the fade up mode. This mode starts at label UP 526 (SEQ 33), where the first action is to wait for 16 ms in block 538. After this delay, a check is made to see if the finger down signal has been activated at block 540. Since an automated up or down fade could be interrupted at any time by a manual override, the finger down signal should be constantly monitored, here every 20 ms. If a finger down is detected and confirmed, control passes to manual mode to start the override.

Following the check for finger down, the up button is sampled again to confirm it is still down in block 542. Again, requiring two consecutive signals from the button, separated by a 16 ms delay, avoids spurious responses to noise spikes or contact bounce. If the button press is not confirmed, the program returns to the wait state in block 544.

Having confirmed the button press, the program now will increment the output level one count every 117 ms to complete the fade in approximately 30 seconds. As indicated in block 546, after every 20 ms of this fade, the program checks for finger down, in case a manual override has been requested. Following the 117 ms delay, the program increments the fade level in block 548, and checks to see if the fade is over in block 550, i.e. if the dimmer has reached the full on state. If the fade is over, the program returns to the wait state at block 552. If the fade is not over, the updated level is stored in memory and output to the dimmer at block 554. The program then loops to start on the next 117 ms delay interval.

FIG. 18 illustrates the flow of control in the fade down mode. Control here is very similar to the face up mode. The mode starts at label DOWN 556 (SEQ 55), and immediately begins a 16 ms delay at block 558. Following this, a check is made for finger down in block 560, in case a manual override has been requested. The fade down button is then sampled a second time in block 562, to confirm the button press. If the button press is not confirmed, the program proceeds to the wait state in block 564. If the button press is confirmed, the program proceeds to the main fading loop where the output level is decremented once every 117 ms. As indicated by block 566, the finger down signal is sampled every 20 ms of this interval to insure a quick response to a manual override. Once the 117 ms delay is completed, the program checks to see if the fade is over at block 568, i.e. if the dimmer is in the full off state. If the fade is over, the program returns to the wait state at block 570. If the fade is still progressing, the output level is decremented in block 572, and the new level is stored in memory as well as output to the dimmer in block 574. Following this, the program loops to start the next 117 ms delay interval.

FIG. 19 illustrates the routine CHKFNG. This routine is called from the fade up and fade down modes to detect and confirm whether a request for manual override has been made. It is called repeatedly (usually every 20 ms) whenever it is necessary to check for override. The routine starts at label CHKFNG 576 (SEQ) and first reads the touchplane to see if a finger down signal is sensed at block 578. If finger down is not detected, the program clears the flag at block 580 and returns at block 582. The flag is used to determine when two successive finger down signals have been detected. If the finger is down, then the flag is checked to see if this is the second successive finger down in block 584. If not, this is the first finger down and so the flag is set in block 586 and the routine returns at block 588. If this is indeed the beginning of a manual override, the next call to CHKFNG will trigger a manual override. If this is the second time a finger down has been detected, then the program jumps immediately to manual mode at block 590.

APPENDIX A

ISIS-II 8048 ASSEMBLER, V1.2
TOUCHPLANE AUTOMATED FADE PROGRA

```
LOC  OBJ       SEQ          SOURCE STATEMENT

1 ;
0000           2         ORG     0H
               3 ;
0000 0410      4 RESTRT: JMP    BEGIN    ;RESTART LOCATION
               5 ;
               6 ;
0010           7         ORG     10H
0010 BA00      8 BEGIN:  MOV    R2,#0     ;LEVEL(R2):=0
0012 9A00      9         ANL    P2,#0     ;OUTPUT(P2):=0
               10 ;
0014 A5       11 WAIT:   CLR    F1
0015 09       12         IN     A,P1      ;INPUT FROM TOUCHPLANE
0016 121E     13         JB0    MANUAL    ;FINGER DOWN?
0018 262F     14         JNT0   UP        ;FADE UP?
001A 464E     15         JNT1   DOWN      ;FADE DOWN?
001C 0414     16         JMP    WAIT
              17 $       EJECT
```

ISIS-II 8048 ASSEMBLER, V1.2
TOUCHPLANE AUTOMATED FADE PROGRA

```
LOC  OBJ       SEQ          SOURCE STATEMENT 001E 2338     18 MANUAL: MOV    A,#56
0020 146D     19         CALL   DELAY     ;WAIT TO CONFIRM FINGER DOWN
              20 ;
0022 09       21 MAN1:   IN     A,P1
0023 122A     22         JB0    MAN5      ;FINGER STILL DOWN?
0025 7614     23         JF1    WAIT      ;FINGER UP 2ND TIME, EXIT
0027 B5       24         CPL    F1        ;FINGER UP 1ST TIME
0028 041E     25         JMP    MANUAL    ;LOOP
              26 ;
```

```
002A AA          27 MAN5:   MOV    R2,A        ;STORE NEW OUTPUT LEVEL
002B 3A          28         OUTL   P2,A        ;AND OUTPUT IT
002C A5          29         CLR    F1          ;CLEAR F1 SINCE FINGER IS DOWN
002D 041E        30         JMP    MANUAL      ;AND LOOP
                 31 ;
                 32 ;
002F 2338        33 UP:     MOV    A,#56
0031 146D        34         CALL   DELAY       ;WAIT TO CONFIRM TO
0033 1475        35         CALL   CHKFNG      ;CHECK FOR FINGER DOWN
0035 3614        36         JT0    WAIT        ;BACK TO WAIT IF NOT CONFIRMED
                 37 ;
0037 2347        38 UP1:    MOV    A,#71
0039 146D        39         CALL   DELAY       ;START 1ST TIMING INTERVAL
003B 1475        40         CALL   CHKFNG      ;CHECK FOR FINGER DOWN
003D BF05        41         MOV    R7,#5       ;INIT LOOP CNTR
003F 27          42 UP5:    CLR    A
0040 146D        43         CALL   DELAY       ;NEXT PIECE OF INTERVAL
0042 1475        44         CALL   CHKFNG
0044 EF3F        45         DJNZ   R7,UP5      ;LOOP
                 46 ;
0046 FA          47         MOV    A,R2        ;GET OLD LEVEL
0047 17          48         INC    A           ;INCREMENT
0048 C614        49         JZ     WAIT        ;CHECK FOR FADE DONE
004A AA          50         MOV    R2,A        ;STORE NEW LEVEL
004B 3A          51         OUTL   P2,A        ;AND OUTPUT IT
004C 0437        52         JMP    UP1
                 53 ;
                 54 ;
004E 2338        55 DOWN:   MOV    A,#56
0050 146D        56         CALL   DELAY       ;WAIT TO CONFIRM T1
0052 1475        57         CALL   CHKFNG      ;CHECK FOR FINGER DOWN
0054 5614        58         JT1    WAIT        ;BACK TO WAIT IF NOT CONFIRMED
                 59 ;
0056 2347        60 D1:     MOV    A,#71
0058 146D        61         CALL   DELAY       ;START 1ST TIMING INTERVAL
005A 1475        62         CALL   CHKFNG
                 63 ;
005C BF05        64         MOV    R7,#5       ;INIT LOOP CNTR
005E 27          65 D5:     CLR    A
005F 146D        66         CALL   DELAY       ;START NEXT PIECE OF INTERVAL
0061 1475        67         CALL   CHKFNG      ;CHECK FOR FINGER DOWN
0063 EF5E        68         DJNZ   R7,D5
                 69 ;
0065 FA          70         MOV    A,R2        ;GET OLD LEVEL
0066 C614        71         JZ     WAIT        ;CK FOR END OF FADE
0068 07          72         DEC    A           ;DECREMENT LEVEL
0069 AA          73         MOV    R2,A        ;STORE NEW LEVEL
006A 3A          74         OUTL   P2,A        ;AND OUTPUT IT
006B 0456        75         JMP    D1
                 76 $       EJECT
ISIS-II 8048 ASSEMBLER, V1.2
TOUCHPLANE AUTOMATED FADE PROGRA

LOC  OBJ         SEQ        SOURCE STATEMENT

77 ;       THIS IS A SUBROUTINE TO DELAY FOR A SPECIFIED
```

```
                            78 ;   AMOUNT OF TIME. ON CALL, A HAS INITIAL VALUE FOR TIMER REG.
                            79 ;
                            80 ;
006D 62                     81 DELAY:  MOV   T,A      ; INIT TIMER REG
006E 55                     82         STRT  T        ; START TIMER
006F 1673                   83 DLY1:   JTF   DLY2     ; DELAY OVER?
0071 046F                   84         JMP   DLY1     ; NO, KEEP CHECKING
0073 65                     85 DLY2:   STOP  TCNT     ; OVER, STOP TIMER
0074 83                     86         RET            ; AND RETURN
                            87 ;
                            88 ;
                            89 ;
                            90 ;
                            91 ;
                            92 ;       THIS IS A ROUTINE TO CHECK IF A FINGER PRESS HAS BEEN
                            93 ;   DETECTED. BEFORE THE FIRST CALL, F1 MUST BE CLEARED. THEN
                            94 ;   THIS ROUTINE IS CALLED AFTER EVERY MINOR TIMING INTERVAL.
                            95 ;   NOTE: IF A FINGER PRESS IS DETECTED, THIS ROUTINE WILL NOT
                            96 ;   RETURN, BUT WILL FIX STACK AND RETURN TO MAN1.
                            97 ;
                            98 ;
0075 09                     99 CHKFNG: IN    A,P1     ; READ TOUCHPLANE
0076 127A                  100         JB0   CF5      ; FINGER DOWN?
0078 A5                    101         CLR   F1       ; NO, CLEAR F1
0079 83                    102         RET            ; AND RETURN
                           103 ;
007A 767E                  104 CF5:    JF1   CF10     ; FINGER DOWN 2ND TIME?
007C B5                    105         CPL   F1       ; NO, 1ST TIME FINGER DOWN
                           106                        ; SET F1 AND CONFIRM NEXT TIME
007D 83                    107         RET
                           108 ;
007E A5                    109 CF10:   CLR   F1       ; CONFIRMED FINGER PRESS
007F C7                    110         MOV   A,PSW
0080 07                    111         DEC   A        ; FIX UP STACK, SINCE NOT RETURNING
0081 D7                    112         MOV   PSW,A
0082 0422                  113         JMP   MAN1     ; AND JMP TO MANUAL MODE
                           114 ;
                           115         END
```

USER SYMBOLS

| BEGIN | 0010 | CF10 | 007E | CF5  | 007A | CHKFNG | 0075 | D1   | 0056 | D5     | 005E | DELAY | 006D |
|-------|------|------|------|------|------|--------|------|------|------|--------|------|-------|------|
| DLY1  | 006F | DLY2 | 0073 | DOWN | 004E | MAN1   | 0022 | MAN5 | 002A | MANUAL | 001E | RESTRT| 0000 |
| UP    | 002F | UP1  | 0037 | UP5  | 003F | WAIT   | 0014 |      |      |        |      |       |      |

ASSEMBLY COMPLETE, NO ERROR(S)

We claim:

1. A level controlling device comprising:
position sensing transducer means having an elongated transducing surface for detecting the presence and position of an operator's finger on the tranducing surface; and
circuit means connected to the transducer means for producing a first signal representative of the fact that an operator's finger is present on the transducing surface and a second signal representative of the position of the operator's finger on the transducing surface for controlling the level of a utilization device.

2. A level controlling device as in claim 1 wherein the position sensing transducer means comprises:
an elongated conductor on the transducing surface; and
an elongated resistor on the transducing surface spaced from and parallel to the elongated conductor, and having a higher electrical resistance than the elongated conductor.

3. A level controlling device as in claim 2 wherein the circuit means comprises:
a source of potential connected to the elongated conductor;
differential amplifier means connected to each end of the elongated resistor for differentially amplifying the potential produced at each end of the elongated resistor when an operator's finger is in contact with both the elongated conductor and the elongated resistor to produce an output signal indicative of the position of the operator's finger along the length of the elongated resistor; and
detector means coupled to the elongated resistor for detecting a potential indicative of an operator's finger in contact with both the elongated conductor and the elongated resistor and for producing in response thereto the first signal.

4. A level controlling device as in claim 3 wherein the differential amplifier means comprises:
a first current pump connected to a first end of the elongated resistor;
a second current pump connected to a second end of the elongated resistor; and
a differential voltage amplifier having first and second differential inputs, and having an output, the first differential input being connected to the first end of the elongated resistor and the second differential input being connected to the second end of the elongated resistor; and
wherein the detector means comprises:
a source of reference potential; and
a voltage comparator having a first input connected to the source of reference potential and a second input connected to one end of the elongated resistor.

5. A level controlling device as in claim 4 further comprising analog-to-digital converter means connected to the output of the differential voltage amplifier for producing a digital signal representative of the output signal thereof.

6. A level controlling device as in claim 1 wherein the position sensing transducer means comprises a linear array of switches.

7. A level controlling device as in claim 6 wherein the circuit means comprises:
a source of a periodic timing signal;
counter means connected to the source of a periodic timing signal for repetitively counting the periodic timing signals up to a predetermined number and for producing on an output thereof a signal representative of the instantaneous count in the counter means;
scanner means connected to the counter means and to the linear array of switches for sequentially scanning the linear array of switches and for producing an output signal in response to one of the switches in the linear array being activated;
position output latch means connected to the counter means and the scanner means for storing the instantaneous count of the counter means in response to receipt of the output signal from the scanner means and for producing the second signal; and
first signal latch means connected to the counter means and the scanner means for producing the first signal in response to receipt of the output signal from the scanner means.

8. A level controlling device as in claim 7 wherein the linear array of switches comprises a plurality of membrane switches.

9. A level controlling device as in claim 7 wherein the linear array of switches comprises a plurality of capacitive switches.

10. A level controlling device as in claims 5 or 7 further comprising visible output means connected to the circuit means for producing a visible indication of the position of the operator's finger on the transducing surface.

11. A level controlling device as in claim 10 wherein the visible output means has a longitudinal axis which is parallel with the longer dimension of the elongated transducing surface and the visual indication produced by the visible output means is aligned with the physical position of the operator's finger on the transducing surface.

12. A level controlling device as in claim 11 wherein the visible output means comprises a linear array of light emitting devices and a digital decoder/driver circuit connected to the light-emitting devices.

13. A position sensing device comprising:
touch-sensitive transducer having an operating surface; and
circuit means connected to the touch-sensitive transducer for producing a first signal in response to an operator's finger being placed on the operating surface and for producing a second signal to indicate the location of the operator's finger on the operating surface.

14. A position sensing device as in claim 13 further comprising display means connected to the circuit means for displaying the position of the operator's finger on the operating surface.

15. A position sensing device as in claim 14 wherein the operating surface is an elongated generally planar surface and the display means has an elongated display surface located adjacent to and parallel with the operating surface.

16. A position sensing device as in claim 15 wherein the touch-sensitive transducer has a plurality of discrete sensitive regions arranged in a linear array and the display means has a plurality of discrete display regions arranged in a linear array.

17. A position sensing device as in claim 16 wherein the circuit means includes electronic scanner means connected to the plurality of discrete sensitive regions for scanning the sensitive regions and producing an output signal in response to an operator's finger being placed in contact with one of the sensitive regions.

18. A position sensing device as in claim 17 wherein the circuit means further includes storage means connected to the scanner means for storing an indication of the sensitive region being scanned when the scanner means output signal is produced.

19. A position sensing device as in claim 18 wherein each sensitive region is a touch-sensitive switch element.

20. A position sensing device as in claim 14 wherein each display region is a light-emitting device.

21. A position sensing device as in claim 13 wherein the touch-sensitive transducer means comprises:
an elongated conductor on the operating surface; and an elongated resistor on the operating surface spaced from and parallel to the elongated conductor, and having a higher electrical resistance than the elongated conductor.

22. A position sensing device as in claim 21 wherein the circuit means comprises:
- a source of potential connected to the elongated conductor;
- differential amplifier means connected to each end of the elongated resistor for differentially amplifying the potential produced at each end of the elongated resistor when an operator's finger is in contact with both the elongated conductor and the elongated resistor to produce an output signal indicative of the position of the operator's finger along the length of the elongated resistor; and
- detector means coupled to the elongated resistor for detecting a potential indicative of an operator's finger in contact with both the elongated conductor and the elongated resistor and for producing in response thereto the first signal.

23. A position sensing device as in claim 22 wherein the differential amplifier means comprises:
- a first current pump connected to a first end of the elongated resistor;
- a second current pump connected to a second end of the elongated resistor; and
- a differential voltage amplifier having first and second differential inputs, the first differential input being connected to the first end of the elongated resistor and the second differential input being connected to the second end of the elongated resistor; and wherein the detector means comprises:
- a source of reference potential; and
- a voltage comparator having a first input connected to the source of reference potential and a second input connected to one end of the elongated resistor.

24. A position sensing device as in claim 23 further comprising analog-to-digital converter means connected to the output of the differential voltage amplifier for producing a digital signal representative of the output signal thereof.

25. In an automated control system having programmed control means for controlling the level of a utilization device connected thereto, a manual override control comprising:
- display means connected to the programmed control means for displaying the current level of the utilization device under control;
- a touch-sensitive control panel;
- circuit means connected to the display means and the control panel for detecting the presence of an operator's finger on the control panel and producing a first signal to cause the program control means to interrupt program control of the level of the utilization device, and for determining the position of the operator's finger on the control panel and producing a second signal to establish the level of the utilization device in response to the position of the operator's finger.

26. A manual override control as in claim 25 wherein the control panel has a plurality of sensing areas arranged in a linear array and the display means has a plurality of display areas arranged in a linear array adjacent to and parallel to the sensing areas.

27. A manual override control as in claim 26 wherein the circuit means includes electronic scanner means connected to the sensing areas for scanning the sensing areas and producing an output signal in response to an operator's finger being placed on one of the sensing areas.

28. A manual override control as in claim 27 wherein the circuit means further includes storage means connected to the scanner means for storing an indication of the position of the sensing area being scanned when the scanner means output signal is produced.

29. A manual override control as in claim 28 wherein each display area is a light-emitting device.

30. A manual override control as in claim 29 wherein each sensing area is an element of a touch-sensitive switch.

31. A manual override control as in claim 28 wherein the utilization device is a theater light.

* * * * *